United States Patent [19]
Miller et al.

[11] Patent Number: 5,572,206
[45] Date of Patent: Nov. 5, 1996

[54] DATA COMPRESSION METHOD AND SYSTEM

[75] Inventors: John W. Miller, Kirkland; Ben W. Slivka, Clyde Hill, both of Wash.

[73] Assignee: Microsoft Corporation, Redmond, Wash.

[21] Appl. No.: 271,125

[22] Filed: Jul. 6, 1994

[51] Int. Cl.$^6$ .................................................. H03M 7/30
[52] U.S. Cl. .................................................. 341/51
[58] Field of Search .......................... 341/51, 106, 107, 34187, 55

[56] References Cited

U.S. PATENT DOCUMENTS

| | | | |
|---|---|---|---|
| 4,021,782 | 5/1977 | Hoerning | 340/172.5 |
| 4,464,650 | 8/1984 | Eastman et al. | 340/347 DD |
| 4,701,745 | 10/1987 | Waterworth | 340/347 DD |
| 4,730,348 | 3/1988 | MacCrisken | 375/122 |
| 4,906,991 | 3/1990 | Fiala et al. | 341/51 |
| 5,016,009 | 5/1991 | Whiting et al. | 341/67 |
| 5,046,027 | 9/1991 | Taaffe et al. | 364/521 |
| 5,155,484 | 10/1992 | Chambers, IV | 341/55 |

OTHER PUBLICATIONS

Bell, Timothy, et al., *Text Compression*, Prentice Hall, New Jersey, 1990, pp. 214–243, 303–310.

Bell, Timothy, "Longest Match String Searching for Ziv–Lempel Compression," Submitted to Workshop on Algorithms and Data Structures, Carleton University, Canada, 1989.

Bell, Timothy, "A Unifying Theory and Improvements for Existing Approaches to Text Compression," doctoral dissertation, University of Canterbury, Christchurch, New Zealand, 1986.

Bell, Timothy, "Better OPM/L Text Compression,"*IEEE Transactions on Communications*, vol. 34, No. 12, Dec. 1986, pp. 1176–1182.

Bell, Timothy, et al., "Modeling for Text Compression," *ACM Computing Surveys*, vol. 21, No. 4, Dec. 1989, pp. 557–591.

Brent, R. P., "A Linear Algorithm for Data Compression," *The Australian Computer Journal*, vol. 19, No. 2, May 1987, pp. 64–68.

Chambers, Lloyd, "Fast Data Compressor With Direct Lookup Table Indexing Into History Buffer," Software Source Code Appendix, Salient Software, Inc., 1991, pp. A1–A10.

Cleary, John G., and Witten, Ian H., "Data Compression Using Adaptive Coding and Partial String Matching," *IEEE Transactions on Communications*, vol. 32, No. 4, Apr. 1984, pp. 396–402.

Fiala, Edward R., and Greene, Daniel H., "Data Compression With Finite Windows," *Communications of the ACM*, vol. 32, No. 4, Apr. 1989, pp. 490–505.

Fiala, Edward R., Greene, Daniel H., "Compressimpl.mesa" and Compressimpl4KUF.mesa, Xerox Corp., 1984, pp. 1–18.

Horspool, R. Nigel, and Cormack, Gordon V., "A General–Purpose Data Compression Technique With Practical Computer Applications," *CIPS Session 84*, 1984, pp. 138–141.

Lempel, Abraham, and Ziv, Jacob, "On the Complexity of Finite Sequences," *IEEE Transactions on Information Theory*, vol. 22, No. 1, Jan. 1976, pp. 75–81.

Storer, James A., and Szymanski, Thomas G., "The Macro Model for Data Compression," *Tenth Annual ACM Symposium on Theory of Computer*, 1978, pp. 30–39.

Welch, Terry A., "A Technique for High–Performance Data Compression," *Computer*, Jun. 1984, pp. 8–19.

Ziv, Jacob, "Coding Theorems for Individual Sequences," *IEEE Transactions on Information Theory*, vol. 24, No. 4, Jul. 1978, pp. 405–412.

Witten, Ian H., et al., "Compress and Compact Discussed Further," *Communications of the ACM, Technical Correspondence*, vol. 31, No. 9, Sep. 1988, pp. 1139–1140, 1145.

Ziv, Jacob, "On Universal Quantization," *IEEE Transactions on Information Theory*, vol. 31, No. 3, May 1985, pp. 344–347.

Ziv, Jacob, and Lempel, Abraham, "A Universal Algorithm for Sequential Data Compression," *IEEE Transactions on Information Theory*, vol. 23, No. 3, May 1977, pp. 337–343.

James A. Storer et al., "Data Compression via Textual Substitution," *Journal of the Association for Computing Machinery*, vol. 29, No. 4, Oct. 1982, pp. 928–951.

*Primary Examiner*—Brian K. Young
*Attorney, Agent, or Firm*—Seed and Berry LLP

[57] ABSTRACT

A method and system for compressing an input stream of data bytes into a compressed stream of data bytes using an LZ77-based compression scheme. The method and system also includes a decompressor for decompressing the compressed stream into a decompressed stream of data bytes that is identical to the input stream. The compression system encodes matches using token offsets rather than the byte offsets used by prior art LZ77-based compression schemes. The compression system uses knowledge of the internal format of the input stream to identify tokens that are used to determine the token offsets. Preferably, the method parses the input stream by dividing it into tokens and assigning a token type to each token. The method searches the input stream for a matching sequence of already processed tokens that is identical to a current sequence of tokens. If a matching sequence is found, the method determines whether the token type of a selected token, such as the first token, of the current sequence matches the token type of a corresponding token of the matching sequence. The method determines a token offset indicating the number of bytes of the matching token type occurring between the selected byte and the corresponding byte of the matching sequence. The method determines the length of the match and encodes the current sequence as a match pair that includes the token offset and the length of the match.

35 Claims, 5 Drawing Sheets

```
                        1         2         3         4
Position:      0123456789012345678901234567890123456789012
Input Stream:  the_workers_did_their_other_work_over_there
```

Compressed Stream the_workers_did_<16,3>ir_o<7,3><6,2><24,4>_ov<10,3><15,4>e

FIG. 1 (Prior Art)

```
                        1         2         3         4
Position:      0123456789012345678901234567890123456789012
Input Stream:  the_workers_did_their_other_work_over_there
Token Type:    01230123456701230123450123450123401234012340123401234
```

01234567
the_
workers_
did_
their_
other_
work_
over_
there

Compressed Stream the_workers_did_<3,3>ir_othe<1,2><4,4>_over_<4,3>re

FIG. 3

| Address | Instruction | Operation | Operand |
|---|---|---|---|
| 00-01 | EB14 | JUMP | (DISP 14) |
| 02-04 | FF46F6 | INC | WORD PTR [BP-0A] |
| 05-07 | 8B5EF6 | MOV | BX,WORD PTR [BP-0A] |
| 08-0A | C607F6 | MOV | BYTE PTR [BX],F6 |
| 0B-0D | FF46F6 | INC | WORD PTR [BP-0A] |
| 0E-0F | F625 | MUL | AL,DL |
| 10-12 | 8B5EF6 | MOV | BX,WORD PTR [BP-0A] |
| 13-15 | C60718 | MOV | BYTE PTR [BX],18 |
| 16-18 | FF46F6 | INC | WORD PTR [BP-0A] |

43A / 43B / 43C / 43D

| 0 | 1 | 2 | 3 | 4 | 5 | 6 | 7 | 8 | 9 | A | B | C | D | E | F | 10 | 11 | 12 | 13 | 14 | 15 | 16 | 17 | 18 | (Position) |
|---|---|---|---|---|---|---|---|---|---|---|---|---|---|---|---|---|---|---|---|---|---|---|---|---|---|
| EB | 14 | FF | 46 | F6 | 8B | 5E | F6 | C6 | 07 | F6 | FF | 46 | F6 | F6 | 25 | 8B | 5E | F6 | C6 | 07 | 18 | FF | 46 | F6 | History Array 25 |

| P | D | D | P | M | D | P | M | D | P | M | I | P | M | D | P | M | D | P | M | I | P | M | D | Token Array 31 |
|---|---|---|---|---|---|---|---|---|---|---|---|---|---|---|---|---|---|---|---|---|---|---|---|---|
| 1 | 1 | 2 | 2 | 1 | 2 | 3 | 2 | 3 | 4 | 3 | 1 | 5 | 4 | 5 | 6 | 5 | 6 | 7 | 6 | 8 | 7 | 1 | 9 | 8 | 7 | (Count fields) |

P indicates an op-code token type   D indicates a displacement token type
M indicates a "Mod R/M" addressing token type   I indicates immediate data token type Compressed Stream
<E9><14><FF><46><F6><8B><5E><F6><C6><07><F6><3,3><F6><25><4,5><18><4,3>

DATA COMPRESSION METHOD AND SYSTEM

TECHNICAL FIELD

This invention relates generally to a method and system for data compression, and more particularly to a method and system for compressing data using LZ77-based compression.

BACKGROUND OF THE INVENTION

The history of the modem computer has been marked by the persistent demands of users for ever increasing computer power and storage capacity in an ever decreasing amount of space. Early efforts at satisfying the users' demands focused on hardware improvements, that is, building memory devices that store the greatest amount of information in the smallest amount of space. While hardware improvements to date have been tremendous, they have always lagged behind the desires of many computer users.

Although memory capacity and memory access speed continue to improve, microprocessor speeds have increased at a faster rate. As a result, efforts to improve computing speed and memory capacity have focused increasingly on software data compression-storing more data in existing memory devices. Data compression technology ranges from simple techniques such as run length encoding to more complex techniques such as Huffman coding, arithmetic coding, and Lempel-Ziv encoding.

A variety of data compression algorithms derive from work published in Ziv, Jacob and Lempel, Abraham, "A Universal Algorithm for Sequential Data Compression," *IEEE Transactions on Information Theory* 23(3):337–343, May 1977. These algorithms are commonly referred to as LZ77 compression schemes. LZ77 compression schemes are based on the principle that a repeated sequence of characters can be replaced by a reference to the earlier occurrence of the sequence (i.e., a matching sequence). The reference typically includes an indication of the position of the earlier occurrence (typically a byte offset from the start of the repeated sequence) and the number of characters that are repeated (the match length). The references are typically represented as <offset, length> match pairs.

FIG. 1 shows an example of an input character stream that is compressed according to a typical LZ77 compression scheme. The stream "the workers did their other work over there" is shown in uncompressed form. The spaces in the stream are represented by the underscore character ("one underscore"). Above each character is a number indicating the position of the character in the stream.

The compressed stream in FIG. 1 represents the input stream in a LZ77-based compressed form. Since the first 16 characters are not part of a repeated sequence of characters, they are represented in the compressed stream in uncompressed form as items known as literals. However, the sequence "the" starting at position 16 is a repeat of the sequence starting at position 0. The repeated sequence is represented in the compressed stream as the match pair <16,3>. The byte offset of 16 indicates that the sequence is a repeat of the sequence starting 16 characters back in the stream (i.e., position 0), and the match length of 3 indicates that 3 characters are repeated. The next four characters do not begin repeated sequences, so they are represented as literals in the compressed stream. Typically, LZ77-based compression schemes require at least two characters to repeat before replacing the repeating characters with a match pair because it usually takes more bits to represent a match pair of match length 1 than it takes to represent a literal. The match pair <7,3> in the compression stream indicates that the sequence "the" starting at a byte offset of 7 (i.e., position 16) and extending for 3 characters is repeated. The match pairs and literals in the remaining portion of the compressed stream are produced in a manner similar to that described above.

Typically, LZ77-based compression schemes include a literal flag code (e.g., 0) with each literal and a match flag code (e.g., 1 ) with each match pair in the compressed stream. The flag codes are used by a decompressor to distinguish the literals from the match pairs during decompression of the compressed stream into a decompressed stream identical to the input stream. In the example shown in FIG. 1, the decompressor finds the literal flag code included with each of the first 16 literals of the compressed stream and copies the characters represented by the literals onto the decompressed stream. Next, the decompressor finds the match flag code included with the match pair <16,3> of the compressed stream, so the decompressor knows that a match pair must be decoded. The decompressor decodes the match pair <16,3> by looking back 16 characters in the decompressed stream and copying three characters onto the end of the decompressed stream. The decompressor decodes the remainder of the decompressed stream in a similar manner using the flag codes to determine whether to copy a character represented by a literal or a sequence of characters represented by a match pair.

Compression is achieved by representing a repeated sequence as a match pair with fewer bits than it would take to repeat the sequence. Prior art methods have increased compression further by employing variable-length codes to represent the byte offsets and the match lengths. Such variable encoding schemes are well-known, examples of which can be found in Bell, *A Unifying Theory and Improvements for Existing Approaches to Text Compression,* Ph.D. Thesis, University of Canterbury, New Zealand, 1987, which is incorporated herein by reference. Variable encoding schemes typically represent smaller byte offsets with fewer bits than larger byte offsets, because repeated strings typically occur shortly after one another. Similarly, variable encoding schemes typically represent shorter match lengths with fewer bits than longer match lengths because shorter repeated sequences typically occur more often than longer repeated sequences. While prior art compression methods have provided good compression, efforts continue to search for even greater compression.

SUMMARY OF THE INVENTION

The present invention provides a method and system for compressing an input stream of data bytes into a compressed stream of data bytes using an LZ77-based compression scheme. The present invention also provides a method and system for decompressing the compressed stream into a decompressed stream of data bytes that is identical to the input stream. The present invention encodes matches using token offsets rather than the byte offsets used by prior art LZ77-based compression schemes. The compression system uses knowledge of the internal format of the input stream to identify tokens that are used to determine token offsets.

The method of the present invention first parses the input stream into tokens, then processes each character by determining whether it is the start of a repeated sequence with a matching token, and encoding each repeated sequence as a match pair that includes a token offset and match length. Preferably, the method parses the input stream by dividing it into tokens and assigning a token type to each token. The method then searches the input stream for a matching sequence of already processed tokens that is identical to a current sequence of tokens. If a matching sequence is found, the method determines whether the token type of the first token of the current sequence matches the token type of the first token of the matching sequence. If the token types match, the method determines a token offset indicating the number of tokens of the matching token type occurring between the current sequence and the matching sequence. The invention determines the length of the match and encodes the current sequence as a match pair that includes the token offset and the length of the match. By encoding the current sequence using a token offset rather than a byte offset typically used with LZ77-based schemes, the invention uses fewer bits to represent the current sequence, thereby providing better compression than prior LZ77-based schemes.

BRIEF DESCRIPTION OF THE DRAWINGS

FIG. 1 is an example of an input stream compressed according to a prior art LZ77 method.

FIG. 3 is an example of an input stream compressed according to the present invention.

FIG. 4 is a schematic diagram of data structures used to compress an input stream according to the present invention.

FIG. 6 is a schematic diagram of search data structures used to compress an input stream according to the present invention.

DETAILED DESCRIPTION OF THE INVENTION

Figure 2:
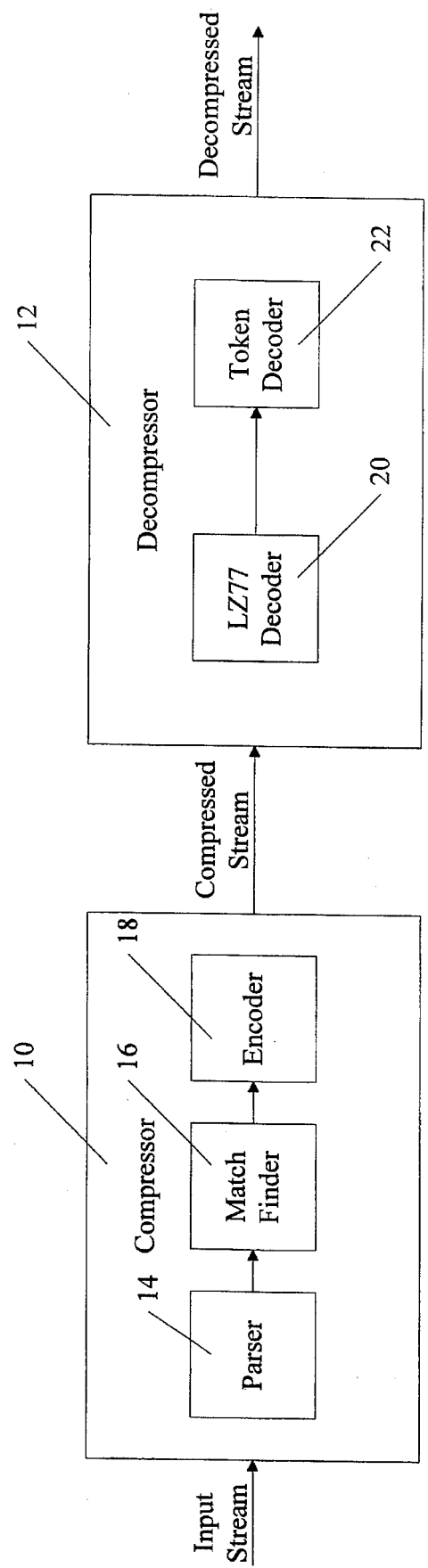
FIG. 2 is a block diagram of a data compression system according to the present invention.

The present invention provides a method and system for compressing an input stream of data bytes into a compressed stream using an LZ77-based compression scheme. The present invention also provides a method and system for decompressing the compressed stream into a decompressed stream of data bytes that is identical to the input stream. The compression system encodes matches using token offsets rather than the byte offsets used by prior art LZ77-based compression schemes. The compression system uses knowledge of the internal format of the input stream to identify tokens that are used to determine the token offsets.

The compression system first parses the input stream into tokens, then processes each character by determining whether it is the start of a repeated sequence with a matching token, and encoding each repeated sequence as a match pair that includes a token offset and match length. The compression system parses the input stream by dividing it into tokens and assigning a token type to each token. For example, if an input stream comprises computer machine code instructions, then the parsing algorithm may divide the input stream into tokens that are instruction fields and assign token types indicating the different types of instruction fields, such as an operation code (op-code), an address or an immediate data byte. The compression system then processes the input stream by searching for sequences of already processed tokens that match a current sequence of tokens. The compression system determines that a sequence matches the current sequence when their byte values match and the token type of the start of the matching sequence is the same token type as the start of the current sequence. The token type of the start of the current sequence is referred to as the current token type.

For example, suppose the current sequence is "C6 07 18," which is an Intel 80×86 machine code instruction equivalent to the assembly language instruction "Mov [07], 18," the parser assigns a token type of "op-code" for the "C6", a token type of "address" for the "07" instruction field, and a token type of "immediate data" for the "18" instruction field. (The sequence "C6 07 18" corresponds to 3 bytes and is shown in hexadecimal notation.) The first two bytes of the current sequence would match the first two bytes of "C6 07 20", which is a machine code instruction equivalent of the assembly language instruction "(Mov [07], 20)", because the byte values are the same and the token type of the first byte of each sequence is "op-code." However, the first two bytes of the current sequence would not match the last two bytes of "C6 C6 07", which is a machine code instruction equivalent of the assembly instruction "(Mov DH, 07)" because the "C6" and "07" in the "C6 C6 07" are of the "address" and "immediate data" token types, respectively. Because the start (C6) of the matching sequence "C6 07" has the same token type (op-code) as the start of the current sequence, a token offset equal to a count of the number of tokens of the current token type between the current sequence and the matching sequence is sufficient to uniquely identify the start of the matching sequence. Consequently, when a matching sequence is found, the compression system encodes the current string as a match pair that includes the token offset and the length of the match.

FIG. 2 is an overview block diagram of the data compression system of the present invention. A compressor 10 receives an input stream of data bytes and outputs a compressed stream. A decompressor 12 receives the compressed stream and outputs a decompressed stream that is identical to the input stream. In a preferred embodiment, the compressor and decompressor are implemented on a computer system comprising a central processing unit, a memory, and input/output devices. In alternate embodiments, the compressor and decompressor are implemented using a special-purpose computer system or using discrete logic devices. The compressor and decompressor may be used to compress and decompress various types of data including data stored in memory, stored on disk, or transmitted on a communications channel.

The compressor 10 includes a parser 14 that divides the input stream into tokens and assigns a token type to each token. The token types used depends on the type of data in the input stream. Preferably, the parser is implemented by a finite state machine, examples of which are well known in the computer science field. One example of a parser is a disassembler, which divides machine code into instruction field tokens and assigns each of these tokens a token type that indicates that type of instruction field for the token. Another example of a parser would be a finite state machine that labels characters of the English language according to whether the immediately previous character is a number, capital letter, small letter, punctuation, etc.

Figure 6:
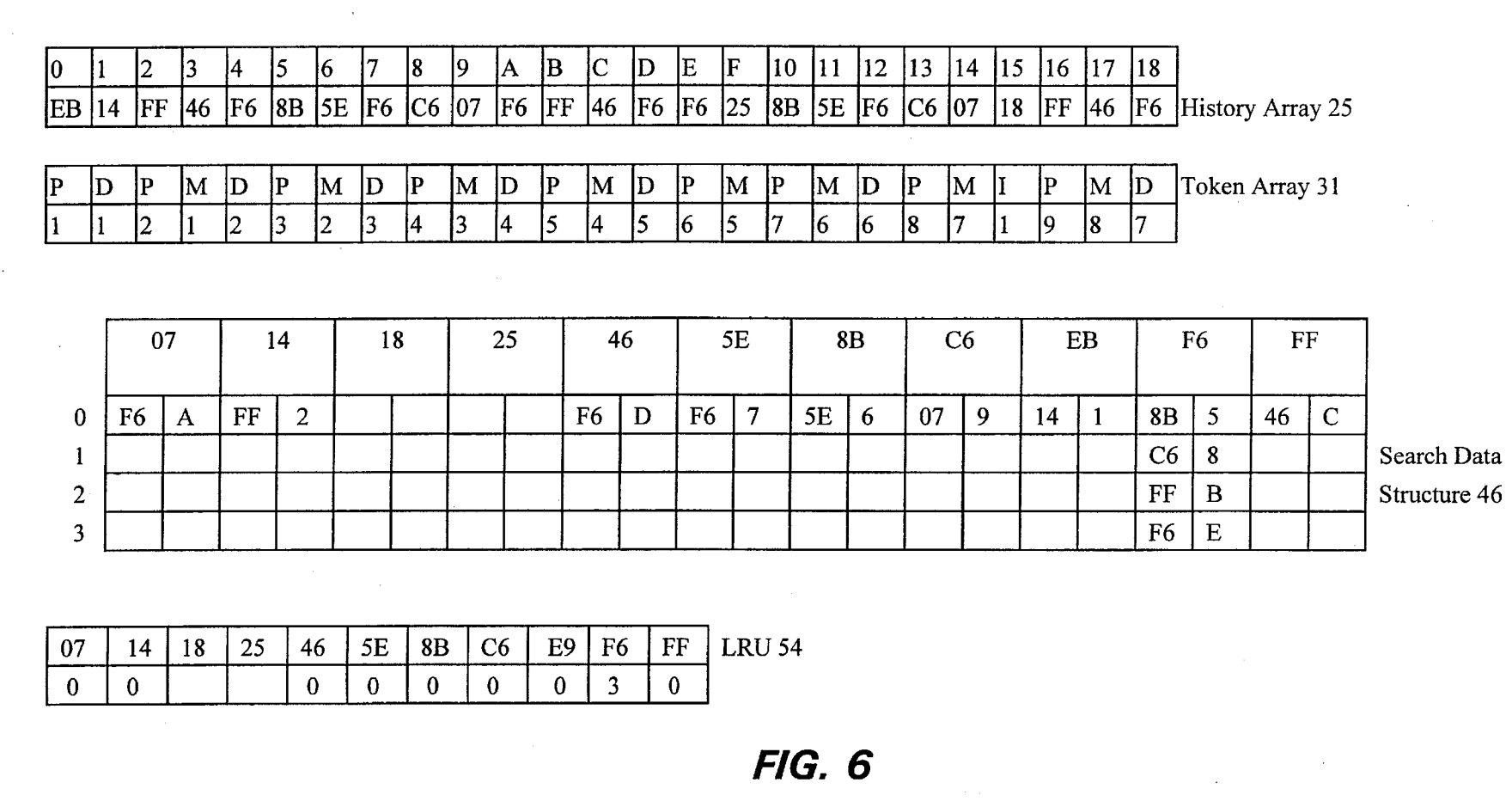

The compressor 10 also includes a match finder 16 that searches the input stream for a matching sequence of already processed bytes that is identical to a current sequence of bytes. Numerous kinds of search methods are possible, ranging from a simple linear search of the input stream to more complicated hashing and tree-based methods. Some examples of well-known searching methods can be found in Bell et at., *Text Compression,* Prentice-Hall, Inc., United States, 1990, which is incorporated herein by reference. In addition, discussed below with respect to FIG. 6 is a preferred search method employing a multi-dimensional direct address table.

After the match finder 16 determines whether a match is found, an encoder 18 encodes the resulting match as a match pair or the resulting single byte as a literal if no match was found. Preferably, the encoder uses a variable encoding scheme in which shorter matches are encoded with fewer bits than longer matches. Preferably, the match finder uses variable encoding for both the token offset and match length portions of a match pair.

The compressed stream output by the compressor 10 can be either stored for later decompression or transmitted to a remote location where it is decompressed. The decompressor 12 includes an LZ77 decoder 20 which decodes the match pairs and literals using its pre-programmed knowledge of the encoding scheme used by the encoder 18 to produce the compressed stream. The LZ77 decoder outputs the single byte decoded from each literal to the decompressed stream. Each decoded match pair produced by the LZ77 decoder includes a token offset and a match length.

The LZ77 decoder 20 sends each token offset to a token decoder 22 which accesses the matching string indexed by the token offset and copies to the decompressed stream a number of bytes equal to the match length. In order to decode the token offsets the token decoder has knowledge of the parsing algorithm used by the parser to assign token types to the tokens of the input stream. Preferably, the parser 14 and token decoder 22 are programmed with several parsing algorithms for several types of data (e.g. machine code, text, etc.) and the compressor 10 places header information on the compressed stream which indicates to the token decoder which parsing algorithm was used to create the compressed stream.

A simple example illustrating the compression system of the present invention is illustrated in FIG. 3 using the same input stream used in the prior art example of FIG. 1. In this example, the parser 14 divides the stream into tokens of one byte in length and assigns a token type to each byte according to its position within a word. For example, the "w" in the word "workers" is assigned a token type of "0", because it is the first character of the word. Similarly, the second character "O" is assigned a token type of "1", the third character "r" is assigned a token type of "2", etc. When the parser finds a "_" character, it knows that the next character will be the first character of the next word and will be assigned a token type of "0". The output of the parser is seen in sequential format underneath the input stream with each character of each word being assigned a token type number line. Underneath the sequential format of the parser output is the same input stream in a two-dimensional format. In the two-dimensional format, each of 8 token types are shown on the first line and each subsequent line shows a different word of the input stream. The two-dimensional format is shown to assist the reader in determining with which token type each character is assigned.

None of the first 16 characters are part of a matched sequence, so the match finder 16 outputs each of the characters in literal form. Note that "_" character of the word "did_" matches the "_" character of the word "the_," but the match finder outputs the "_" character in literal form instead of a match pair having a match length of 1. That is because it typically takes more bits to encode a match pair having a match length of 1 than it does to encode a literal, so the match finder preferably only outputs match pair having a match length of at least 2. The "the" sequence at positions 16–18 is a repeat of the "the" sequence positions 0–2 so the match finder outputs a match pair that includes a token offset of 3 and a match length of 3. The token offset is 3 because there are three tokens of the first character token type (labeled "0") between the "t" of the previously occurring matching sequence "the" in positions 0–2 and the "t" of the current sequence "the" in positions 5–7. Thus, the match finder outputs a match pair of <3,3> instead of the match pair <16,3> produced by the prior art compression scheme shown in FIG. 1.

The next 7 characters in positions 19–25 are not part of a matched sequence so are output as literals. It should be appreciated that, in the example shown in FIG. 3, a matching sequence is found only if the first character of the current sequence is of the same token type as the first token of the matching sequence. For example, the sequence "the" in the word "other_" matches the sequence "the" of the word "their_," but a matching sequence is not found because the "t" of "other_" is of the token type "1," while the "t" of "their_" is of the token type "0." Although some matches can be missed using the present invention, the compression has been found to improve in most cases because of the decrease in bits needed to encode the shorter token offsets rather than the longer byte offsets of the prior art methods.

After outputting the literals for the characters in positions 19–25 of the input stream, the match finder 16 determines that the "r_" current sequence at positions 26–27 matches the "r_" matching sequence at positions 20–21. The match finder encodes the current sequence as the match pair <1,2>, which identifies the matching sequences as occurring at a token offset of 1 and extending for 2 characters. The match finder determines that the next current sequence "work" at positions 28–31 matches the matching sequence "work" at positions 4–7, which is 4 tokens of type 0 prior to the current sequence, so the match finder encodes the current sequence with the match pair <4,4>. The next 6 characters are not part of a match sequence, so the match finder outputs 6 literals. The next current sequence "the" of the word "there" matches the matching sequence "the" in the word "their_," which is 4 words prior to "their," so the match finder outputs a match pair of <4,3>. The last two characters "re" are not part of a matched sequence, so they are output as literals.

It should also be appreciated that the finite state machine used by the parser 14 to assign token types to the tokens of the input stream must be known to the token decoder 22 of the decompressor. Preferably, the parser and token decoder each include multiple finite state machines that are capable of parsing and decoding multiple types of data, such as machine code, text, etc. As such, the compressor preferably includes header information in the compressed stream indicating which type of data was compressed so that the token decoder can use the proper finite state machine.

Shown in FIG. 4 is another example showing an input stream of data being compressed by the compressor 10 into a compressed stream. In this example, the input stream consists of bytes from a file with Intel 80×86 machine code instructions shown in the second column 43B of the upper portion of FIG. 4, next to addresses of the bytes forming the instructions in the first column 43A. Shown in the third and fourth columns 43C, 43D is the assembly language operator and operand corresponding to the machine code instruction. The general format of Intel 80×86 machine code instructions includes an operation code (op-code) byte that specifies the operations to be executed by the computer. Usually following the op-code is a "Mod R/M" addressing byte that specifies the register or memory location upon which the operations specified by the op-code will act. Often following the "Mod R/M" addressing byte is a displacement field that is used in conjunction with the "Mod R/M" byte to specify an effective address operated on by the operation specified by the op-code byte. Alternatively, when used without a "Mod R/M" addressing byte, the displacement byte is a program relative displacement that indicates where to continue execution of the program when used with a transfer operation, such as a Call or a Jump. The final portion of the Intel 80×86 encoding scheme is an immediate data byte that specifies a constant that will be used as an argument to the operation specified by the op-code byte. It will be appreciated that all numbers, including addresses, shown in FIG. 4 are in hexadecimal notation.

The compressor 10 receives the input stream in a history array 25. In FIG. 4, the history array includes an entry for each byte in the input stream, shown above each entry is the position of the entry within the history array. The parser 14 creates a token array 31 with token types for each byte of the input stream. The token array is parallel to the history array such that each entry in the token array is indexed with the same pointer or offset value used to index the corresponding entry in the history array. Each entry in the token array preferably includes a count field that indicates a sequence number for the entry with respect to the token type associated with the entry. For example, the token array entry associated with the "8B" in position 5 of the history array includes a token type of "P" and a sequence number 3, indicating that the "8B" is the third token of type "P" (op-code) found by the parser 14 for the input stream. The token type of "P" represents an op-code type; the token type of "M" represents a "Mod R/M" type; the token type of "D" represents a displacement type; and the token type of "I" represent immediate data type.

For the first eleven bytes in history array positions 0-A, there are no matching sequences of at least two bytes in length, so the first eleven bytes are output as literals. When the match finder 16 selects the "FF 46" at positions B-C as the current sequence, the match finder determines that the byte values of the sequence match the byte values of the byte sequence "FF 46" at positions 2-3. The match finder determines that the token type (P) for the byte (FF) at position 2 matches the token type (P) for the first byte (FF) of the current sequence at position B. Consequently, the match finder determines that a matching sequence has been found and determines the length of the match. The match finder tries to extend the match by comparing byte "F6" immediately following the current sequence with the byte "F6" immediately following the matching sequence. The match finder continues to compare each byte following the current sequence with a corresponding byte following the matching sequence until the corresponding bytes do not match. Because the byte at position 5 (8B) does not match the byte at position E (F6) the matching sequence is not extended further and the match length equals three bytes.

In order to encode the current sequence as a match pair, the match finder 16 determines the token offset for the matching sequence. Preferably, the match finder calculates a token offset of 3 by subtracting the sequence number (2) in the count field of the token array entry corresponding to the first byte (position 2) of the matching sequence from the sequence number (5) in the count field of the token array entry corresponding to the first byte (B) of the current sequence. The match finder then sends the match pair <3,3> to the encoder 18 which encodes the match pair according to a variable length encoding scheme.

The next two bytes "F6 25" at the input stream do not form part of a matching sequence, so they are output as literals. The next current sequence "8B 5E F6" at positions 10-12 matches the matching sequence "8B 5E F6" at positions 5-7. The count field corresponding to the first byte of the current sequence at position 10 is 7, and the count field corresponding to the first byte of the matching sequence at position 5 is 3, so the token offset is 4 (7-3) and the match finder outputs the match pair <4,5>. The next byte "18" at position 15 does not form part of a matched sequence, so that match finder outputs a literal. The match finder determines that the next current sequence "FF 46 F6" at positions 16-18 matches the matching sequence "FF 46 F6" at positions B-D. The count field corresponding to the byte at position 16 is 9 and the count field corresponding to the byte at position B is 5, so the token offset is 4 (9-5) and the match finder outputs the match pair <4,3>.

In an alternative embodiment, each program relative displacement associated with a transfer operation is converted from a byte displacement to a token displacement by the parser 14. For example, in FIG. 4 the instruction "EB 14" is a jump instruction to the instruction at a program relative displacement of 14 bytes. The program relative displacement is computed from the location of the instruction following the jump instruction, so the displacement 14 indicates a memory location 16 (2+14). An instruction always begins with an op-code (P), so the parser knows that location 16 stores an op-code (P), which in the example, is "FF." Using that knowledge, after parsing is complete, the compression system replaces the displacement of 14 bytes with a token displacement of 7. The 7 is computed by subtracting the sequence number (2) for the token array entry of the next instruction (position 2) from the sequence number (9) for the token array entry for the instruction at position 16. After all program relative byte displacements are converted to token displacements, the match finder searches for matching sequences as described above. In the example, the token displacement "7" at position 1 is not part of a matched sequence so it is output as a literal. Of course, the decompressor converts the token displacement back to the program relative displacement to obtain a decompressed stream that is identical to the input stream.

In most situations, a program relative displacement points to an op-code of an instruction. However, some programmers intentionally use a program relative displacement to point to an instruction field other than an op-code. As a result, when the parser 14 encounters such a non-standard use of a program relative displacement, it adds an escape code to the program relative displacement and does not convert the program relative displacement to a token displacement. The escape code is a value that is not a valid token displacement, such as 00, so that the decompressor will understand that the program relative displacement was not converted to a token displacement.

There are two potential benefits achieved by converting program relative byte displacements to token displacements, which are shorter. First, many encoding schemes variably encode literals, so that shorter token displacements typically are encoded with fewer bits than the longer byte displacements. Second, converting byte displacements to token displacements make it more likely to find matching sequences. For example, assume that an input stream of machine code instructions includes 200 jump instructions ("EB") with byte displacements ranging from 1 to 200. Assume that after conversion the token displacements range from 1 to 75. Because there are 200 token displacements with only 75 different possible values, the probability that there are repeated values is higher than the case where there are 200 byte displacements with 200 different possible values. Therefore, by increasing the probability of repeated values, the conversion of byte displacements to token displacements increases the number of matching sequences found and thereby increases the compression of the input stream.

Figure 5:
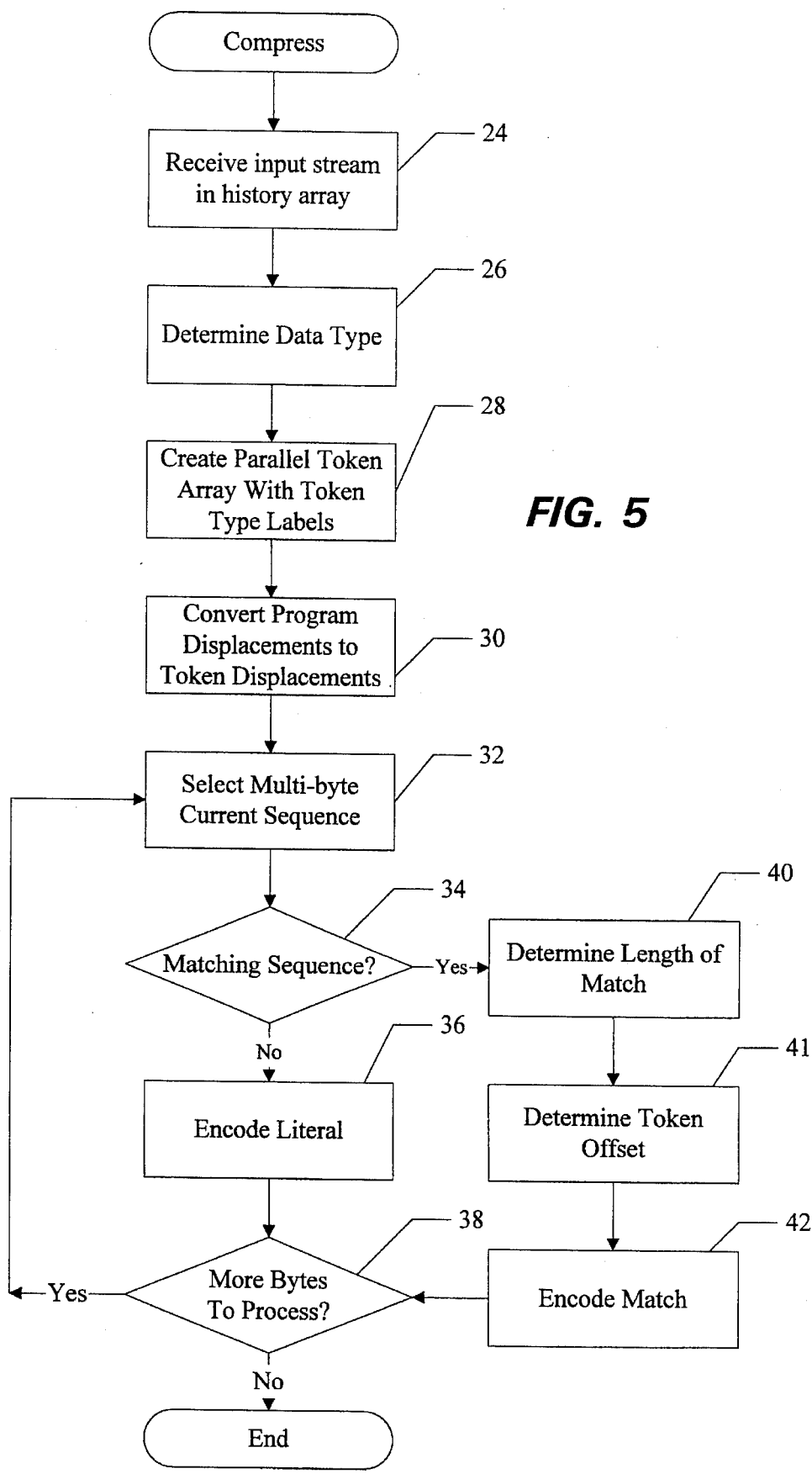
FIG. 5 is a flow diagram of a data compression method according to the present invention.

FIG. 5 is a flow diagram of a compression method according to a preferred embodiment of the present invention. In step 24, the compressor receives the input stream in the history array 25 (FIG. 4). In step 26, the parser 14 determines the data type of the input stream data so that the parser can determine which finite state machine to use to assign token types to the bytes of the input stream. The parser determines the data type based on an indication from a user or a program supplying the input stream or from header information included with the input stream data. Based on the Intel 80×86 machine code data type, the parser knows that there are four token types representing the types of instruction fields. In step 28, the parser 14 creates the token array 31 (FIG. 4) with token types for each byte of the input stream. In step 30, the compression system converts all program relative displacements to token displacements as discussed above.

The match finder 16 in step 32 selects a multi-byte current sequence to be processed. Preferably, the current sequence selected is a minimum of two bytes because a match of only a single byte in length may be difficult to compress. Since, by definition, the first byte of the input stream cannot match a previous byte, the match finder selects the second through third bytes as the first current sequence.

In step 34, the match finder 16 determines whether a matching sequence can be found. As discussed above, many adequate search methods are known in the art and a preferred search method is discussed below with respect to FIG. 6. If the match finder determines that there is no previously processed sequence that matches the current sequence, the match finder outputs a literal for the first byte of the current sequence. In step 36, the encoder 18 encodes the literal. While many methods can be used to encode the literal, a preferred embodiment employs the scheme shown below in Table A. In step 38, the compressor determines whether there are more bytes of the input stream to process. Steps 32–38 are then repeated until a matching sequence of the predetermined minimum number of bytes (preferably 2) is found.

If the match finder 16 finds a matching sequence in step 34, the match finder determines the length of the matching sequence in step 40. The length of the matching sequence is determined simply by a byte-by-byte comparison of the bytes following the current sequence with the bytes following the matching sequence. Preferably, the match length increases with each matching byte until a predetermined maximum length is reached (512 in a preferred embodiment). Note that the token types of the bytes (other than the first) in the matching sequence do not necessarily have to match; it is only the byte values that need match.

In step 41, the match finder 16 determines the token offset for the matching sequence. Preferably, the match finder determines the token offset by subtracting the sequence number located in the token array entry corresponding to the first byte of the matching sequence from the sequence number located in the token array entry corresponding to the first byte of the current sequence (see sequence numbers in token array 31 in FIG. 4). The match finder sends the token offset to the encoder 18 which encodes the current sequence as a match pair that includes the token offset and the match length determined by the match finder.

In step 42, the encoder 18 encodes the match pair of the current sequence according to a variable length encoding scheme. In a preferred embodiment, the encoder uses the scheme recited in Table A. In Table A, each format is read from right to left. The "0" and "11" in the first two rows to the right of the literals are literal flag codes that alert the decompressor that a literal follows. The '001," "0101," and "1101" to the right of the match pairs in the next three rows are match flag codes that alert the decompressor that a match pair follows.

TABLE A

| Format | Meaning | |
|---:|---|---|
| | Literal and Match Group Offset Encoding | |
| xxxxxxx0 | Literal with 7 least significant bits (0 . . . 127) | |
| xxxxxxx11 | Literal with 7 least significant bits (128 . . . 255) | |
| . . . Lxxxxxx001 | Match with a 6-bit offset (0 . . . 63) | followed by length |
| . . . Lxxxxxxxx0101 | Match with an 8-bit offset (64 . . . 319) | followed by length |
| . . . Lxxxxxxxxxxxx1101 | Match with a 12-bit offset (320 . . . 4414) | followed by length |
| 1111111111111101 | EOS pattern (looks like offset=4415) | |
| | Match Length Encoding | |
| 1 | 3 | |
| 010 | 4 | |
| 110 | 5 | |
| 00100 | 6 | |
| 01100 | 7 | |
| 10100 | 8 | |
| 11100 | 9 | |
| 0001000 | 10 | |
| 1001000 | 14 | |
| 1111000 | 17 | |
| 000010000 | 18 | |
| ... .. | | |
| 111110000 | 33 | |
| 00000100000 | 34(11-bit encodings) | |
| ... .. | | |
| 11111100000 | 65 | |

TABLE A-continued

| Format | Meaning |
|---|---|
| 0000001000000 | 66(13-bit encodings) |
| ... .. | |
| 1111111000000 | 129 |
| 000000010000000 | 130 15-bit encodings) |
| ... .. | |
| 111111110000000 | 257 |
| 00000000100000000 | 258(17-bit encodings) |
| ... .. | |
| 01111111100000000 | 512 |

In an alternate embodiment, the encoding used for a literal depends on the token type of the token represented by the literal. Similarly, the encoding used for a match pair depends on the token type of the first token of the matched current sequence. The alternate embodiment uses a different set of encodings, such as Huffman codes or arithmetic codes, for each token type.

As is well known in the art, the Huffman code assigned to each particular value of a set of values depends on statistical data computed for the set. Shorter Huffman codes are assigned to those values occurring more often than the other values in the set. Huffman codes can be assigned statically based on general statistics for the type of data being compressed, or they can be assigned dynamically based on the particular statistics for the actual data being compressed. For example, when assigning static Huffman codes to English text, the letter "e" is always assigned the shortest Huffman code because it is the most common letter in general. However, for a particular text item, such as a story about Mississippi, the letters "s" and "i" might be more common than "e." As a result, dynamic Huffman encoding would yield better compression for the Mississippi story because "s" and "i" would be assigned shorter Huffman codes than "e." However, dynamic Huffman encoding is slower because of the extra time required to maintain statistics and modify the Huffman codes based on the statistics.

In the alternate embodiment of the invention, the method associates each token type with a different set of Huffman codes. The method assigns shorter Huffman codes to token values occurring more often than other token values of the same token type. Preferably, the invention employs dynamic Huffman codes, but static Huffman codes can be employed for more speed and less compression. For example, using the input stream of data shown in FIG. 4, the dynamic Huffman encoding method would assign the shortest Huffman code of the op-code token type to "FF," because "FF" is the most common op-code in the input stream. Similarly, the dynamic Huffman encoding method would assign the shortest Huffman code of the displacement token type to "F6," because "F6" is the most common displacement in the input stream.

It will be appreciated that the encoder 18 need not include any bits in each encoding to distinguish between token types. That is because the finite state machine used by the token decoder 22 of the decompressor 12 and the parser 14 of the compressor 10 is deterministic. That is, the finite state machine knows which type of token will follow each current token. For example, for a "push" operation code, the parser knows that another operation code will immediately follow. Likewise, for a transfer operation, such as the "jump" at address 0 in FIG. 4, the parser knows that a displacement byte (D) will follow. Using such knowledge, the token decoder decodes each of the token offsets in the compressed stream.

FIG. 6 is a block diagram illustrating a sample search data structure 44 in conjunction with the history array 25 in a preferred embodiment. The history array 25 contains an input stream of data bytes, which in the example are the machine code instructions shown in FIG. 4. The number above each byte in the history array indicates the position of the byte within the history array. For example, the byte "F6" is at position 7 within the history array.

The search data structure 46 is a multi-dimensional direct address table that contains an entry for each possible byte. Thus, when a byte contains 8 bits, the table contains 256 entries. For example, the entry indexed by F6 contains search information relating to byte sequences that begin with an "F6." FIG. 6 shows each of the entries of the search data structure immediately adjacent each other for compactness, but the actual search data structure would have all 256 entries in numerical order. Each entry contains a number of slots. A slot contains information that identifies a previous occurrence of a byte sequence in the history array. In the example of FIG. 6, each entry contains four slots. In a preferred embodiment, each entry contains eight slots. In an alternate embodiment, each entry has a variable number of slots based on the expected frequency of the byte in an input stream. One skilled in the art would appreciate that by using more slots, a greater amount of compression can be achieved, but generally at the expense of a greater time of compression. When an entry contains four slots, the search data structure can contain information for four byte sequences that begin with the indexed byte. Each slot contains a next byte field 48 and a position field 50. The next byte field contains the next byte after the indexing byte. The position field contains the position of the next byte in the history array. One skilled in the art would appreciate that a next byte field is included to speed searching. The byte-value of the next byte could be obtained by using the position field as an index into the history array.

The first eleven bytes of the history array contain no matching byte sequences, so the match finder 16 outputs a literal for each byte. The match finder updates the search data structure entry for each of the first eleven bytes such that each entry points to the byte in the history array 25 following the byte associated with the entry. The match finder selects the "FF 46" in positions B-C as the current sequence. The match finder accesses the "FF" entry in the search data structure 46 using the "FF" as an index. The match finder searches the "FF" entry slots for a "46" which is the second byte of the current sequence. The next byte field of the first slot contains a "46" so a matching sequence of two bytes is found ("FF 46"). The position field points to position 3 as the location of the second byte ("46") of the matching sequence. The match finder checks position 2 of the token array 31 to determine whether the first byte ("FF") of the matching sequence is of the same token type as the first byte of the current sequence. Since both bytes are in the op-code group (P), the match finder attempts to extend the matching sequence by comparing the byte at position D with the byte at position 4 and finds the matching sequence "FF 46 F6." The match finder compares the byte at position E with the byte at position 5, but is unable to extend the matching sequence (step 40 of FIG. 5). The match finder determines a token offset of 3 for the matching sequence by subtracting the token sequence number for the first byte of the matching string from the token sequence number for current sequence (5–2=3) (step 41 of FIG. 5). The encoder 18 encodes the current sequence "FF 46 F6" as a match pair with a token offset of 3 and a match length of 3 (step 42). The match finder updates the "FF" entry of the search data structure 46 to identify the current byte sequence.

As shown in FIG. 6, the search data structure 46 contains information on the previous byte sequences when the current byte sequence starts at position E in the history array. The search data structure entry for "F6" contains a slot that identifies each of the four previous byte sequences that begin with an "F6", that is, "F6 8B", "F6 C6", "F6 FF", and "F6 F6." When the current byte sequence "F6 25" at positions E–F is processed, the search data structure 46 is searched to determine whether an "F625" is identified as a previous byte sequence (step 34 of FIG. 5). In this example, no slot for the entry indexed by "F6" contains a "25" as the next byte. Consequently, the compression system overwrites the slot for the "F6" byte that has been least recently updated. In this case, the slot identifying the byte sequence "8B" is replaced with information to identify the current byte sequence "25". Specifically, the next byte field is overwritten with a "25" and the position field is overwritten with an F.

An LRU (least-recently updated) data structure 54 that is parallel to the search data structure 46 contains an entry for each byte and is indexed by the byte. The entries identify the least recently updated slot for the corresponding entry in the search data structure. The LRU structure (as shown) actually contains the slot number (0–3) of the most recently updated slot. The least recently updated slot is obtained by adding 1 to the value in the LRU entry. For example, the least recently updated slot for "F6" is slot 0; so the LRU data structure contains a 3 (3+1 mod 4=0). When the current byte sequence does not match any byte sequence in the search data structure, the LRU is updated to point to the next slot (in a circular fashion) and the next slot is overwritten with the first byte and position of the current byte sequence. One skilled in the art would appreciate that an estimate of a least recently updated slot can be made by selecting the slot with the smallest position value and thus making the LRU data structure unnecessary.

In alternate embodiments, the byte sequence can be any number of bytes. The search data structure could be implemented as a direct access table indexed by two bytes and thus having $2^{16}$ entries. Alternatively, the search data structure could be implemented as a hash table. When a hash table is used, byte sequences with different first bytes could hash to the same entry causing a collision. When a collision occurs, the first byte of each byte sequence identified by a slot would need to be checked to determine a match.

In another embodiment, the slots for each entry could be maintained as a linked list. The linked list could be implemented as an array parallel to the input stream with a slot for each byte in the input stream. Each entry in the search data structure would point to a linked list of slots identifying next byte values. The slots in the linked list would link together next byte values for the same first byte. When searching the linked list, only a certain number of slots are checked for a match. When no match is found, a new slot is added to the beginning of the linked list to identify the current byte sequence. When a matching slot is found, it is preferably removed from the linked list and a new slot added to the beginning of the linked list to identify the current byte sequence.

It will be appreciated that, although specific embodiments of the invention have been described herein for purposes of illustration, various modifications may be made without departing from the spirit and scope of the invention. Accordingly, the invention is not limited except as by the appended claims.

We claim:

1. A computer-implemented data compression method of compressing an input stream of bytes, each byte having a position, comprising:

assigning a token type to each byte of the input stream, the token type assigned to each byte being selected from plural token types;

searching for a matching sequence of already processed bytes that matches a current sequence of bytes;

determining that a selected byte of the current sequence and a corresponding byte of the matching sequence have the same token type;

determining a match length indicating the number of bytes in the matching sequence;

determining a token offset indicating the number of already processed bytes of the same token type positioned between the current sequence and the matching sequence; and appending to an encoded data stream a match code indicating the token offset and the match length.

2. The method of claim 1 wherein the appending step includes assigning the match code according to the token type of the selected byte.

3. The method of claim 1, further comprising:

for each byte not forming part of a matched current sequence, appending to the encoded data stream a literal that indicates the byte.

4. The method of claim 3 wherein the step of appending a literal includes assigning the literal according to the token type of the byte being indicated by the literal.

5. The method of claim 3, further including appending a first literal flag code to the literal if the byte indicated by the literal is within a first range of values and appending a second literal flag code to the literal if the byte indicated by the literal is within a second range of values.

6. The method of claim 5, further including forming the literal from less than all of the bits of the byte indicated by the literal, such that when the first literal flag code is appended to the literal, the literal and first literal flag code do not include more bits than the byte indicated by the literal.

7. The method of claim 1 wherein the input stream of bytes is a stream of machine code bytes readable by a computer, and wherein the assigning step includes assigning an operation code token type to a plural number of the bytes and assigning a program relative displacement token type to a chosen byte, the chosen byte indicating the number of bytes between the chosen byte and a targeted byte that was assigned an operation code token type, the method further comprising:

replacing the chosen byte with a token displacement byte indicating the number of operation code bytes in the input stream between the chosen byte and the targeted byte.

8. The method of claim 7 wherein the current sequence includes the chosen byte and the determining a token offset step includes determining the token offset to indicate the number of bytes of the program relative displacement token type positioned between the chosen byte and a corresponding byte of the matching sequence.

9. The method of claim 1, further comprising:

decompressing the encoded data stream into a decompressed data stream identical to the input stream.

10. A computer-implemented data compression method of compressing an input stream of data, comprising:

parsing the input stream by dividing the input stream into tokens and assigning a token type to each token;

searching for a matching sequence of already processed tokens that matches a current sequence of tokens;

determining that a selected token of the current sequence and a corresponding token of the matching sequence are each of a first token type;

determining a match length indicating the number of tokens in the matching sequence;

determining a token offset indicating the number of already processed tokens of the first token type between the current sequence and the matching sequence; and appending to an encoded data stream a match flag code indicating the token offset and the match length.

11. The method of claim 10 wherein the appending step includes assigning the match code according to the token type of the selected token.

12. The method of claim 10, further comprising:

for each token not forming part of a current sequence that is identical to a matching sequence, appending to the encoded data stream a literal that indicates the token; and appending to the literal a literal flag code distinguishing the literal from the match flag code.

13. The method of claim 12 wherein the step of appending a literal includes assigning the literal according to the token type of the token being indicated by the literal.

14. The method of claim 10 wherein the input stream of data is a stream of machine code instructions readable by a computer, and wherein the parsing step includes assigning an operation code token type to a plural number of the tokens and assigning a program relative displacement token type to a chosen token, the chosen token indicating the number of tokens between the chosen token and a targeted token that was assigned an operation code token type, the method further comprising:

replacing the chosen token with an token displacement token indicating the number of operation code tokens in the input stream between the chosen token and the targeted token.

15. The method of claim 14 wherein the current sequence includes the chosen token and the determining a token offset step includes determining the token offset to indicate the number of tokens of the program relative displacement token type positioned between the chosen token and a corresponding token of the matching sequence.

16. The method of claim 10, further comprising:

decompressing the encoded data stream into a decompressed data stream identical to the input stream.

17. A method in a computer system for compressing data, the data comprising a multiplicity of tokens, each token having a token value and one of a plurality of token types, the method comprising the steps of:

determining the token type of each token;

finding a matching sequence of tokens having the same token values as a current sequence and having a token with the same token type as a corresponding token in the current sequence; and representing the current sequence based on a count of tokens having the same token type, the count of tokens indicating a position of the matching sequence.

18. The method of claim 17, further comprising:

appending to an encoded data stream a representation of the current sequence resulting from the representing step; and for each token not forming part of a current sequence that matches a matching sequence, appending to the encoded data stream a literal that indicates the token.

19. The method of claim 18, further including appending a first literal flag code if the token indicated by the literal is within a first range of values and appending a second literal flag code if the token indicated by the literal is within a second range of values.

20. The method of clam 19, further including forming the literal from less than all of the token indicated by the literal, such that when the first literal flag code is appended to the literal, the literal and first literal flag code do not include more bits than the token.

21. The method of claim 17, further comprising:

determining a match length indicating the number of tokens in the matching sequence having the same token values as the current sequence; and determining a token offset indicating the count of tokens, wherein the representing step includes representing the current sequence as a match code indicating the match length and the token offset.

22. A data compression system for compressing an input stream of data, comprising:

a parser that parses the input stream by dividing the input stream into tokens and assigns a token type to each token;

a match finder that finds a matching sequence of tokens that matches a current sequence of tokens, the matching sequence having a token with the same token type as a corresponding token in the current sequence; and an encoder that encodes the current sequence as a match code indicating a count of tokens of the same token type, the count of tokens indicating a position of the matching sequence.

23. The data compression system of claim 22 wherein the encoder includes means for appending to an encoded data stream a literal that represents a token not forming part of a current sequence that matches a matching sequence.

24. The data compression system of claim 23 wherein the match code is appended to an encoded data stream, the system further comprising a decompressor that decompresses the encoded data stream into a decompressed stream identical to the input stream.

25. A computer storage medium for controlling a computer to compress data, the data including a plurality of tokens, each token having a token value and one of a plurality of token types, comprising:

computer instructions for determining the token type of each token;

computer instructions for finding a matching sequence of tokens having the same token values as a current sequence and having a token with the same token type as a corresponding token in the current sequence; and computer instructions for representing the current sequence based on a count of tokens having the same token type, the count of tokens indicating a position of the matching sequence.

26. The computer storage medium of claim 25, further comprising:

computer instructions for appending to an encoded data stream a representation of the current sequence resulting from the instructions for representing the current sequence; and for each token not forming part of a current sequence that matches a matching sequence, computer instructions for appending to the encoded data stream a literal that indicates the token.

27. The computer storage medium of claim 26 wherein the computer instructions for appending a literal to the encoded data stream includes:

computer instructions for appending a first literal flag code if the token indicated by the literal is within a first range of values; and computer instructions for appending a second literal flag code if the token indicated by the literal is within a second range of values.

28. The computer storage medium of claim 26 wherein the computer instructions for appending a literal to the encoded data stream includes computer instructions for assigning the literal according to the token type of the token being indicated by the literal.

29. The computer storage medium of claim 25, further including:

computer instructions for determining a match length that indicates the number of tokens in the matching sequence having the same token values as the current sequence; and computer instructions for determining a token offset indicating the count of tokens, wherein the computer instructions for representing the current sequence include computer instructions for representing the current sequence as a match code that indicates the match length and the token offset.

30. A method in a computer system for decompressing encoded data into decoded data having a multiplicity of tokens, each token having a token value and one of a plurality of token types, the encoded data comprising an encoded match code associated with a matched sequence of tokens, the method comprising the steps of:

determining the token type of a selected token of the matched sequence;

determining from the encoded match code a count of tokens having the same token type as the selected token of the matched sequence, the count of tokens indicating a position of a matching sequence of tokens that match the matched sequence of tokens:

accessing the matching sequence using the count of tokens; and decoding the matched sequence based on the token values of the matching sequence.

31. The method of claim 30 wherein the encoded data includes a literal that represents a token not forming part of a matched sequence, further comprising:

determining whether the literal includes a first literal flag code indicating that the token represented by the literal is within a first range of values, and if so, outputting the token from the first range of values; and determining whether the literal includes a literal flag code indicating that the token represented by the literal is within a second range of values, and if so, outputting the token from the second range of values.

32. The method of claim 30 wherein the encoded match code includes a token offset and a match length, the token offset indicating the count of tokens and the match length indicating the number of tokens in the matching sequence having the same token values as the matched sequence, and wherein the decoding step includes copying the token values of the tokens of the matching sequence based on the match length.

33. A method in a computer system for compressing a data string having a sequence of data values, each data value having one of a plurality of data value types, the method comprising:

identifying the data value type of a current data value in the data string;

determining whether a matching data value and its data value type in the data string matches the current data value and its data value type; and encoding the current data value based on a count of data values having the same data value type as the current data value, the count of data values indicating a position of the matching data value in the data string.

34. The method of claim 33 wherein the count of data values further indicates a number of data values that have the same data value type as the current data value and that are in between the current data value and the matching data value.

35. The method of claim 34, further including the step of determining a match length number of data values that follow the current data value and that match the data values that follow the matching data value, wherein the step of encoding further includes encoding the match length number.

* * * * *